US006266289B1

(12) United States Patent
Dubovik et al.

(10) Patent No.: US 6,266,289 B1
(45) Date of Patent: Jul. 24, 2001

(54) METHOD OF TOROID WRITE AND READ, MEMORY CELL AND MEMORY DEVICE FOR REALIZING THE SAME

(75) Inventors: Vladimir Mikhailovich Dubovik, Dubna Moscovskoy; Yury Vyacheslavovich Kislyakov, Moscow; Mikhail Andreevich Martsenyuk, Perm; Pavel Albertovich Ossipov, Moscow; Viktor Alekseevich Senchenko, Dubna Moscowskoy, all of (RU)

(73) Assignee: Amphora, Danville, CA (US)

( * ) Notice: Subject to any disclaimer, the term of this patent is extended or adjusted under 35 U.S.C. 154(b) by 0 days.

(21) Appl. No.: 09/341,535

(22) PCT Filed: Mar. 9, 1999

(86) PCT No.: PCT/RU99/00061

§ 371 Date: Jul. 12, 1999

§ 102(e) Date: Jul. 12, 1999

(87) PCT Pub. No.: WO00/54281

PCT Pub. Date: Sep. 14, 2000

(51) Int. Cl.[7] .................................................. G11C 7/04
(52) U.S. Cl. .......................... 365/213; 365/55; 365/171
(58) Field of Search .................................. 365/213, 171, 365/214, 48, 55, 66, 97, 130

(56) References Cited

U.S. PATENT DOCUMENTS 3,913,080 * 10/1975 Leo et al. .............................. 365/171

(List continued on next page.)

FOREIGN PATENT DOCUMENTS

| 1051257 | 12/1966 | (GB) . |
| 1147349 | 12/1966 | (GB) . |
| 61-050277A | 3/1986 | (JP) . |

OTHER PUBLICATIONS

V.M. Dubovik and V.V. Tugushev, Toroid Moments in Electrodynamics and Solid–State Physics, *Joint Institute of Nuclear Research, Dubna, Physics reports (Review Section of Physics Letters)* 187, No. 4 (1990) 145–202, North–Holland.

(List continued on next page.)

*Primary Examiner*—Vu A. Le
(74) *Attorney, Agent, or Firm*—Gray Cary Ware & Freidenrich

(57) ABSTRACT

A method of toroid writing and reading of information, consisting in that from toroid-like patterns made from a magnetic material the structures are organized, comprising information and reference patterns, having a closed magnetic flux of the appropriate twisting direction. When writing the alternative information, on changes the twisting direction of the closed magnetic flux in appropriate information patterns by exposing them to the coordinated in the time and magnitude action of mutually intersecting biasing and magnetic reversal alternating magnetic fields, and when reading the information, one acts on the information and the reference patterns by an alternative biasing magnetic field, afterwards detects the output signals and on the character of their responses determines the value of the information unit written into the information pattern. The memory cell comprises a toroid-like element, through the axial opening of which a signal busbar passes, developing a vortex magnetic field in the toroid-like element, and the biasing busbar situated off the toroid-like element develops in the toroid-like element the magnetic field being transverse relative to the vortex magnetic one. The memory device comprises a memory array (13), constructed by the information memory cells with K biasing busbar (15) and L signal busbars (16). The busbars (15) are connected to the biasing current generating unit (20) and the busbars (16)—to the data writing current generating unit (21). The biasing busbar (15) and the signal busbar (18) of the reference memory cell are attached to the biasing current generating unit (20) and to the triggering unit (22), correspondingly. The signal inputs of units (20) and (21) are connected to the signal generator (19), and their address inputs to the address decoder (23). The outputs of the busbars (16) and the busbar (18) are connected to the detectors assembly (24), whose output is connected to the electronic control unit (25). The controller (26) controls the operation of the memory device.

19 Claims, 6 Drawing Sheets

U.S. PATENT DOCUMENTS

| | | | |
|---|---|---|---|
| 5,126,971 | * 6/1992 | Lin et al. | 365/171 |
| 5,587,943 | 12/1996 | Torok et al. | 365/158 |
| 5,650,958 | 7/1997 | Gallagher et al. | 365/173 |
| 5,768,182 | 6/1998 | Hu et al. | 365/145 |
| 5,796,670 | 8/1998 | Liu | 365/228 |

OTHER PUBLICATIONS

V.M. Dubovik, M.A. Martsenyuk, N.M. Martsenyuk, Reversal of Magnetization of Aggregates of Magnetic Particles by a Vorticity Field and Use of Toroidness for Recording Information, *Journal of Magnetism and Magnetic Materials*. 145 (1995) 211–230.

J.A. Heras, Electric and Magnetic Fields of a Toroidal Dipole in Arbitrary Motion, *Phys. Lett.*, A 249 (1998) 1–9.

G.N. Afanasiev and V.M. Dubovik, Electromagnetic Properties of Toroidal Solenoid, Laboratory of Theoretical Physics, Joint Institute for Nuclear Research, Dubna, J. Phys. A: Math. Gen. 25 (1992) 4869–4886.

V.M. Dubovik and S.V. Shabanov, The Gauge Invariance, Toroid Order Parameters and Radiation in Electromagnetic Theory in Essays on the Formal Aspects of Electromagnetic Theory (pp. 399–474) Ed. A. Lakhakia (*World Scientific*, Singapore, New Jersey, London, Hong Kong, 1993).

V.M. Dubovik, M.A. Martsenyuk, N.M. Martsenyuk, Toroid Polarization of Aggregated Magnetic Suspensions and Composites and its Use for Information Storage, *Phys. Part. Nucl.* 24 (4), Jul.–Aug. 1993.

Serban Misicu, Toroidal Collective Motions in the Atomic Nucleus, Abstract of Dissertation, Institute for Nuclear Physics & Engineering, Department of Theoretical Physics, Bucharest, Romania, 1995.

* cited by examiner

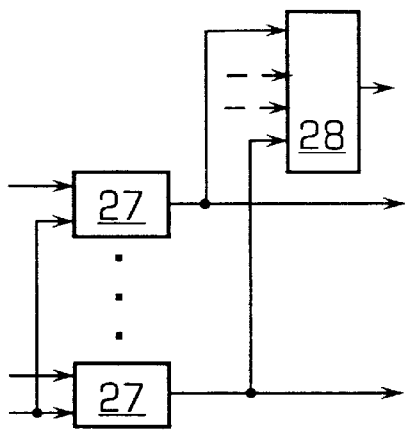
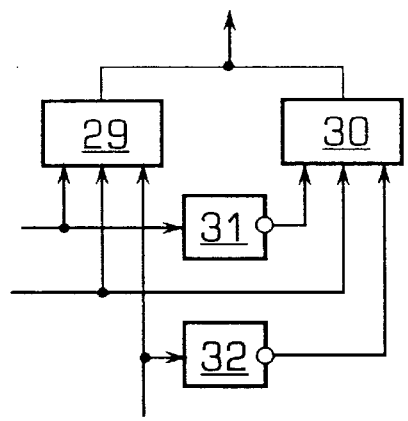
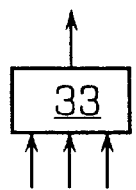
FIGURE 11     FIGURE 12     FIGURE 13
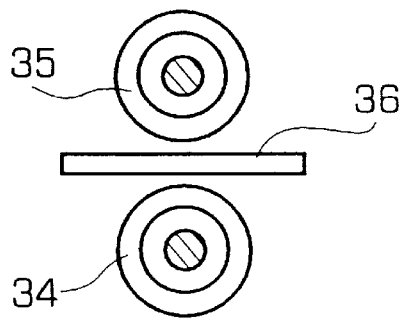
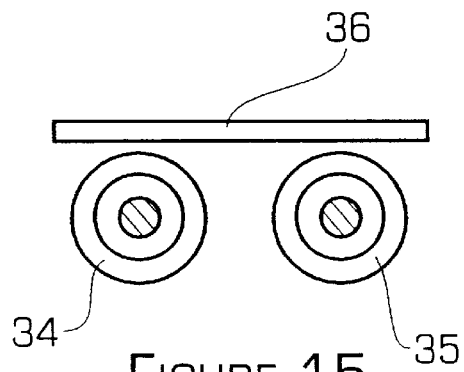
FIGURE 14     FIGURE 15
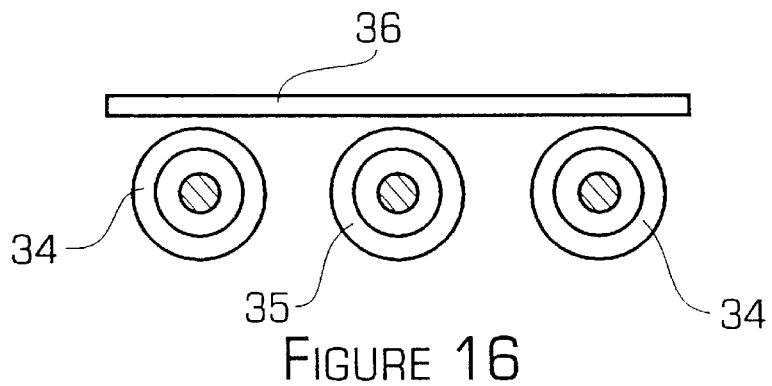
FIGURE 16

METHOD OF TOROID WRITE AND READ, MEMORY CELL AND MEMORY DEVICE FOR REALIZING THE SAME

BACKGROUND OF THE INVENTION

The present invention relates primarily to magnetic write and read of data and can be used in arrangements with reverse digital high-density memory devices which are intended for operations with large data arrays and in other electronic equipment.

One of the fundamental units in the modem computer technology and in other electronic systems is a memory device, the efficiency of which is characterized by the following basic parameters: stored data capacity and write density, access time (duration of the whole cycle of random address data retrieval), non-volatility of storage (possibility to store data in the event of power loss), lifetime under use and cost for mass production of 1 MB of the memory.

Recently, optical disks surpassed all other memory devices in capacity (from 128 to 2000 MB), but unfortunately, they are either not adapted to the rewrite operations or their write and read time is very long (for example, the access time amounts to 30–50 ms). The hard magnetic disks can store large arrays of information (up to 10 GB) and possess a rewrite capability. The access time is reduced to 8–15 ms, and yet it is still very long. Both types of memory devices (optical disks and hard magnetic disks) are non-volatile.

A dynamic random-access memory (DRAM) employs a charged capacitor as the data storing element (memory cell). Such devices are made in a form of integrated circuits, which results in a very short access time of about 10–50 ns and a write density of 3–12 MB/cm$^2$. However, DRAMs are volatile and require a periodic refreshing.

A static memory device employs a solid-state gate in the transistor assembly storing element (memory cell). Such devices are intricate for fabrication and can be used only as a cache memory, i.e., as a buffer for exchange between the slow and fast memory devices. The disadvantages of static memories are limited non-volatility, comparatively low density (1–2 MB/cm$^2$) and rather high cost.

Recently, efforts have been made to create a memory device that is free of the above disadvantages, but concurrently provides a high density of writing (about 100 MB/cm$^2$), a short access time (about 10 ns), is non-volatile has an unlimited number of rewrite and read cycles, and a low cost of fabrication. The so-called ferroelectric and magnetic memory devices meet these requirements most closely.

It is known that a numerous class of polycrystals, designated as ferroelectrics, possesses the property of being able to maintain the state of a given electrical polarization for a long time. This property allows them to be used in memory cells instead of the dielectric between the capacitor plates in the dynamic memory with the result that the dynamic memory takes on the property of nonvolatility.

Unfortunately, the ferroelectric memory devices have a limited lifetime. Even after a limited number of polarization reversals, the ferroelectric begins to age due to accumulating a spurious electric charge in the crystal. The absolute magnitude of the electrical polarization in the memory cell decreases, and the cell becomes less operable and eventually loses its memory properties (U.S. Pat. No. 5,768,182, Int.Cl. H01L 31/062 (365/145), 1998).

The same disadvantage is peculiar to the memory devices based on other high-quality dielectrics, as the mere fact of availability of electric charges inevitably leads to gradual ageing of the dielectric memory through the leakage of the spurious charge (U.S. Pat. No. 5,796,670, Int. Cl. G11C 13/00 (365–228), 1998).

There is a method and a device with a so-called "magnetic" random access memory (MRAM), where the write and read operations rest on the property of a conductor to change the electrical resistance in the event of applying a magnetic field (effect of anisotropic resistance (AMR) or giant magnetoresistance (GMR)).

The device comprises either individual circuits for writing and reading data or (in the event of using conductors with the GMR) multilayer structures. Each memory cell comprises separate elements for writing, storing and reading the data. Such a memory cell is capable of bearing a practically unlimited number of rewriting cycles, due to stability of the so-called "exchanging" forces of interactivity of atomic electrons and by the absence in the nature of magnetic charges that could lead to depolarization of the magnetic dipole moments of data carriers (U.S. Pat. No. 5,587,943, Int.Cl. G11C 11/15 (365/158, 1996).

A disadvantage of this method is that the effect of the AMR manifests itself only against the background of very high ohmic resistance of conductors. When a single circuit is used both for writing and for reading the information, a strong current is passed through the conductor, this results in manifestation of an electromigration effect (transfer of a portion of the substance of the current busbar together with the electrical current), which leads to the loss of normal operation of the memory cell.

Additional disadvantages of a device realizing the method are rather low write density and difficulty of its fabrication, while the usage of conductors with the GMR results in strong dependence of the device operation on the temperature, i.e., lower temperatures are preferable.

A memory device (magnetic transistor) is known, whose operation is based on using spin dependent effects of transferring the charges in a magnetic field (electron tunneling effect). The charge tunneling in the magnetic transistor between two layers of a metal ferromagnetic, separated by a layer of the dielectric, is controlled by the magnetic field (U.S. Pat. No. 5,650,958, Int. Cl. G11B 5/127 (365/173), 1997).

A disadvantage of this design is the dependence of the memory device operation on the temperature, i.e., the warm-up of the device during long-term operations causes instability of hysteresis curves. In addition, the technology of the device fabrication is complicated; it is required to apply about ten layers of various materials, including dielectrics. There is a method and a memory device to realize it, which is based on usage of magnetic particles (domains) being longitudinally or transversely arranged on the carrier and possessing magnetic dipole moments.

For writing and reading the information the memory device uses relative movement of a carrier with magnetic particles and a magnetic head, which generates during writing and records during reading a magnetic field which is homogeneous in direction and varying in strength. The writing density in this case is at the level of 10$^8$–10$^9$ bit/cm$^2$ (M. B.Gitlits "Magnetic Recording of Signals", Moscow, "Radio & Svyaz", 1990, p.232).

Among the disadvantages of the above design are limitations of the writing density resulting from the rigid coupling of magnetic particles (domains) during multiplexing, a risk of losing information under influence of external fields, as well as a limited lifetime of carriers and a limited reliability of memory devices due to the necessity to use units which execute high speed mechanical motion for write and read operations.

There is a method of magnetic-toroid writing and reading of information based on the interaction of magnetized particles of the carrier, which are concentrically closed into toroid-like patterns (aggregates of the carrier's magnetic particles) with a controlling vortex magnetic field: The magnetic field changes the orientation of the moments of magnetic particles during writing of information and registers the parameters of electrical field excited by moving aggregates of the carrier's magnetic particles during reading of information (V. M. Dubovik, A. M. Martsenyuk, N. M. Martsenyuk "Magnetic reversal of Aggregates of Magnetic Particles by a Vortex Magnetic Field and Usage of a Toroid Feature for Data Writing." Reprint of Joint Institute for Nuclear Research, R .17-92-541, 1992). Two magnetization states of such aggregates, referred to as logical "0" and logical "1" in the digital code, differ by opposite (clockwise or counter-clockwise) directions of the magnetization vortex and, accordingly by oppositely oriented vectors of toroid moments.

The package density of particle aggregates with toroid magnetization is practically limited only by their sizes by virtue of weak interaction between aggregates. The nanotechnology methods allow one to obtain single-domain ferromagnetic particles of size 1–10 nm with a saturation magnetization in the order of 300 emu/cc. For example, an aggregate consisting of four such particles has a toroid magnetization with the strength of the vortex magnetic field between the aggregate's particles of about $10^3$ oersted. This is sufficient for the aggregate stability and hence for reliable long-term storage of information. Since each of those aggregates is capable of storing 1 bit of information and the area of the aggregate is 10–100 $nm^2$, the writing density will be equal to $10^{12}$–$10^{13}$ $bit/cm^2$.

A disadvantage of this design is the complexity of its implementation. During reading of a separate data bit, it requires difficult-to-attain quick travel of the reading unit relative to the carrier of stored information and, during writing, requires a difficult-to-get toroid moment value needed for providing the vortex magnetization reversal of an aggregate with the alternative electric field.

Besides, the application of a flat capacitor for creating a vortex magnetic field does not allow a high degree of localization of the vortex field within the limits of one aggregate having a nanometric size.

A prior art method of toroid data writing and reading which is close to the invention consists in that toroid-like patterns are formed in a material, for example magnetic, each of these patterns has a closed magnetic flux with an appropriate direction of twisting; during writing a unit of alternative information, the twisting direction of the closed magnetic flux in respective toroid-like patterns is changed (Russian Federation (RF) Pat. No. 2114466, Int.Cl. G11B 5/00, 5/852, 1998). However, the known method does not provide a random access to the memory, has a rather long access time, and requires a complex process of phase detection during reading operations, especially at high frequencies.

A prior art memory cell which is close to the invention incorporates a toroid-like element made of a magnetic material and placed in an insulating medium (Russian Federation Pat. No. 2114466, Int.Cl. G11B 5/00, 5/582, 1998). Unfortunately, the known device is unable to provide the required writing density and speed and is complicated in manufacturing.

A prior art memory device which is close to the invention, realizing the above mentioned method of data writing and reading, comprises toroid-like elements, a means for magnetic reversal of toroid-like elements and an electronic control unit (Russian Federation Pat. No. 2114466, Int.Cl. G11B 5/00, 5/852, 1998). However, the known device is unable to provide the required writing density and speed and is complicated in manufacturing.

Besides, the write and read head is a matrix with numerous nanometrical needles, fixed in the dielectric, and requires a precision device, which shall provide relative travel of the head and of the carrier of toroid-like magnetic patterns.

SUMMARY OF THE INVENTION

It is an object of this invention to develop a method of data writing and reading, a memory cell and a memory device for realizing the same, in order to provide mass production of relatively cheap, durable, non-volatile memory devices which have the advantage of large capacity, high density writting, short access time and high speed.

The essence of the method of toroid writing and reading of information is in that the toroid-like patterns are formed from a material, for example a magnetic material. Each of those patterns has a closed magnetic flux with a particular direction of twisting orientation. From those toroid-like patterns structures are formed which comprise at least one information and at least one reference pattern.

When writing a unit of information within a single structure, one changes the direction of the closed magnetic flux in appropriate toroid-like patterns and exposes the informational pattern to mutually intersecting biasing and magnetic reversal alternative magnetic fields, this exposure being coordinated in the time and magnitude.

When reading a unit of information within a single structure, one acts on the informational and the reference patterns by an alternative biasing magnetic field, detects the output signals of information and reference patterns of the structure, and on the character of their responses determines the value of a unit of information written into an information pattern.

A unit of information can be written within a single structure by acting on the information pattern with one or several pulses of magnetic reversal field under the constant action of the biasing magnetic field. The toroid-like patterns can be formed of a material with a superconducting property, for example, of the high-temperature superconducting ceramics.

Furthermore the essence of the invention is that in the memory cell comprising a toroid-like element made of magnetic material and placed in the insulating medium, a means is inserted for magnetic reversal of the toroid-like element through developing within its volume space-time configuration of the magnetic field comprising at least one current-conducting signal busbar going through an axial opening in the toroid-like element and developing a vortex magnetic field therein. At least one current-conducting biasing busbar is located outside the toroid-like element and develops a magnetic field which is transverse relative to the vortex one.

If the toroid-like element in the memory cell is made of a conducting magnetic material, the toroid-like element and the current-conducting biasing and signal busbars are isolated from each other. If the toroid-like element is made of a nonconducting material, the current-conducting biasing busbar can be placed directly on the toroid-like element. The current-conducting biasing busbar of the memory cell can be made in the shape of a loop embracing the toroid-like element.

It is possible to interpose the toroid-like element within the memory cell between the two current-conducting biasing busbars arranged oppositely to each other, or between four current-conducting biasing busbars, the first two of which are arranged oppositely to each other above the equatorial plane of the toroid-like element and the other two are arranged oppositely to each other below the equatorial plane of the toroid-like element. The current-conducting signal busbar, or at least one of them, may be arranged, in both cases, transversely with respect to the current-conducting biasing busbars.

Furthermore, a portion of the toroid-like element adjoining to the current-conducting biasing busbar in the memory cell can be made of a magnetically hard material, for example, ferrite, and a magnetoclosing portion can be made of a magnetically soft material, for example, Permalloy. Silicon oxide can be used as a dielectric material for the insulating medium.

The essence of the invention also is that information memory cells and at least one reference memory cell, a signal generator, a biasing current generating unit, a data writing current generating unit, a triggering unit, an address decoder, a detectors assembly and a controller are introduced into a memory device comprising toroid-like elements, a means for magnetic reversal of toroid-like elements, and an electronic control unit.

Each of the information memory cells and each of the reference memory cells includes the toroid-like element and a means for magnetic reversal of toroid-like element. The reversing means may comprising at least one current-conducting signal busbar, and at least one current-conducting biasing busbar. The information memory cells are organized into blocks providing the word-to-word random access to the information; blocks of information memory cells form a memory array consisting of K rows and L columns, where K is the number of current-conducting biasing busbars, and L is the number of current-conducting signal busbars.

Each of K current-conducting biasing busbars of the information memory cells and the current-conducting biasing busbar of each or at least one of reference memory cells are connected with appropriate outputs of the biasing current generating unit. Each of L current-conducting signal busbars of the information memory cells is connected with an appropriate output of the data writing current generating unit, and the current-conducting signal busbar of each or at least one of the reference memory cells is connected with the output of the triggering unit.

The output of the signal generator is connected to signal inputs of the biasing current generating unit, the data writing current generating unit, and the triggering unit, the first and the second outputs of the address decoder are connected to the K address inputs of the biasing currents generating unit and to the L address inputs of the data writing currents generating unit respectively.

Each of L current-conducting signal busbars of the information memory cells and a current-conducting signal busbar of each or at least one of the reference memory cells are connected to appropriate inputs of the detector assembly, L outputs of which are connected to information inputs of the electronic control unit, the outputs of the address codes and data outputs of which are connected to the inputs of the address decoder and to the L data inputs of the data writing currents generating unit respectively. The control signal output of the electronic control unit is connected to the like input of the triggering unit.

The address code inputs, the data inputs-outputs and the control signals inputs-outputs of the electronic control unit are connected with appropriate outputs and inputs-outputs of the controller, the information input of the triggering unit serves as an input of the signal logical 1.

The reference memory cells can be arranged variously with respect to the information memory cells. For example, each of the reference memory cells (at least one reference memory cell) and an adjacent appropriate information memory cell can be placed on one side of the current-conducting biasing busbar, or each of the reference memory cells (at least one reference memory cell) can be interposed between two appropriate information memory cells, which are placed on one side of the current-conducting biasing busbar, or each of the reference memory cells (at least one reference memory cell) also can be positioned as a mirror image of a certain information memory cell with respect to the axial line of the current-conducting biasing busbar.

Additionally, the reference memory cells can be made in the shape of a reference array, the geometrical dimensions of which are identical to the geometrical dimensions of the memory array, both arrays are positioned symmetrically about the biasing currents generating unit and the detectors assembly.

BRIEF DESCRIPTION OF DRAWINGS

The present invention is illustrated in the accompanying drawings, wherein

FIG. 11–FIG. 13 represent schematic diagrams for elements of the biasing current generating unit, the data writing current generating unit, and the triggering unit, respectively.

FIG. 14–FIG. 16 show the position of the informational memory cell and the reference memory cell relative to each other and relative to the current-conducting biasing busbar.

DESCRIPTION OF PREFERRED EMBODIMENTS

The memory cell (FIG. 2–FIG. 5) comprises a toroid-like element 9, a current-conducting signal busbar 10, a current-conducting biasing busbar 11 and an insulating medium 12.

Figure 6:
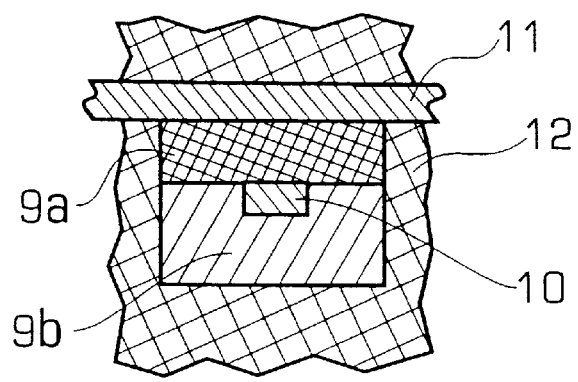
FIG. 6 shows a memory cell in section across the equatorial plane of the toroid-like element made of different magnetic materials.

The memory cell of FIG. 6 comprises a toroid like element 9 composed of two portions 9a and 9b, a current-conducting signal busbar 10, a current-conducting biasing busbar 11 and an insulating medium 12.

Figure 7:
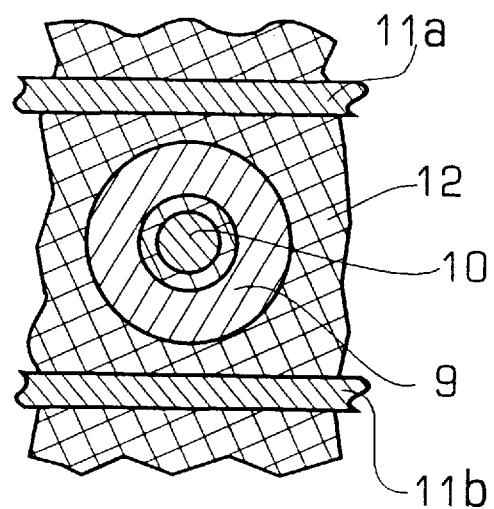
FIG. 7 shows a memory cell in section across the equatorial plane of the toroid-like element with two current-conducting biasing busbars.

The memory cell of FIG. 7 comprises a toroid-like element 9, a current-conducting signal busbar 10, two current-conducting biasing busbars 11a and 11b and an insulating medium 12.

Figures 8, 9:
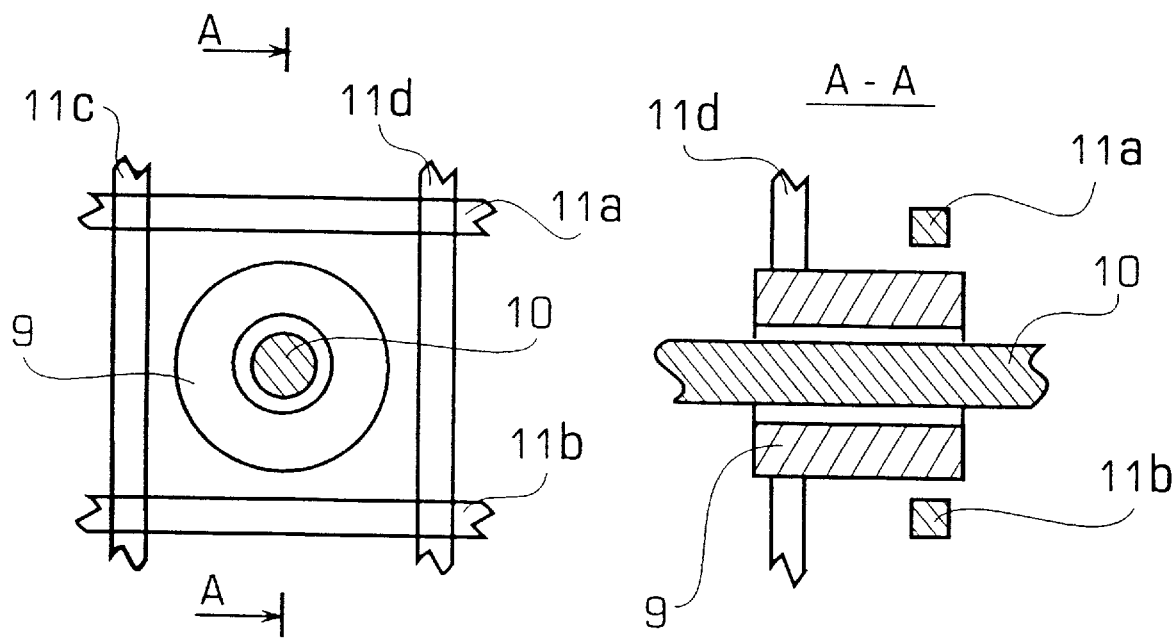
FIG. 8 illustrates a memory cell with four current-conducting biasing busbars.
FIG. 9 shows a memory cell in section across the meridional plane of the toroid-like element with four current-conducting biasing busbars.

The memory cell of FIG. 8 and FIG. 9 comprises a toroid-like element 9, a current-conducting signal busbar 10, four current-conducting biasing busbars 11a, 11b, 11c, 11d (the insulating medium is not shown in the drawings).

The toroid-like element 9 in memory cells can be made of different magnetic materials, which defines its position relative to the means for magnetic reversal creating a space-time configuration of the magnetic field within the space of the toroid-like element 9.

The magnetic reversal means comprises at least one current-conducting signal busbar 10 passing axially through the opening of the toroid-like element 9 for developing a vortex magnetic field in the toroid-like element 9, and at least one current-conducting biasing busbar 11 outside the toroid-like element 9, which develops a magnetic field transverse relative to the vortex magnetic field in the toroid-like element 9.

Figure 3:
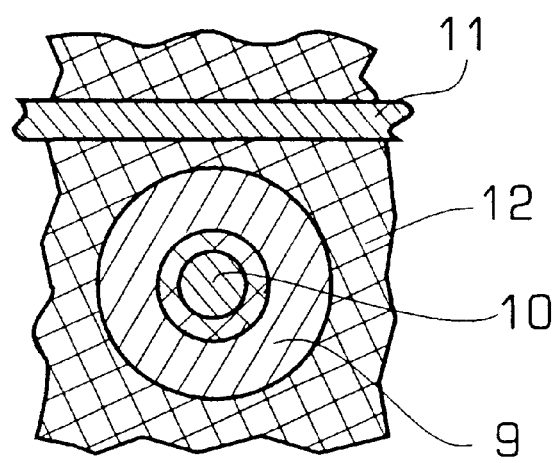
FIG. 3 and FIG. 4 show the memory cells in section across the equatorial plane of the toroid-like element, made of current-conducting and current-nonconducting magnetic material correspondingly.
Figure 4:
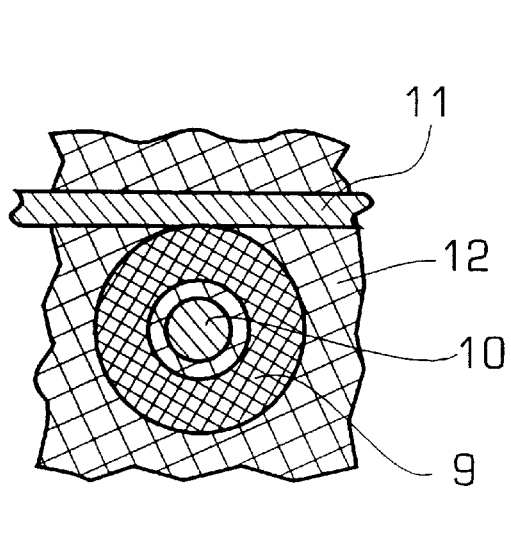

The current-conducting signal and biasing busbars of a memory cell are made of a conducting material, for example silver. The insulating medium is made of a dielectric material, for example silicon oxide, and the toroid-like element 9 is made of a magnetic material. If the magnetic material is conducting, the toroid-like element 9 and the current-conducting signal and biasing busbars 10 and 11 are isolated from each other and placed in the insulating medium, for example silicon oxide (FIG. 3). If the magnetic material is nonconducting or if the upper portion 9a of the toroid-like element 9 is made of a magnetically hard material, for example ferrite, and the magnetoclosed portion 9b is made of a magnetically soft material, for example Permalloy, the current-conducting biasing busbar 11 can be placed directly on the toroid-like element 9 (FIG. 4) or on its upper portion (FIG. 6).

Figure 5:
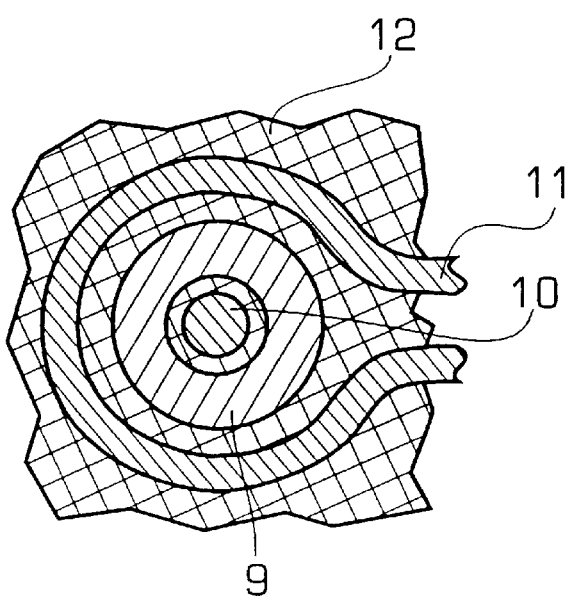
FIG. 5 shows a memory cell in section across the equatorial plane of the toroid-like element with a current-conducting biasing busbar in the shape of a loop.

The current-conducting biasing busbar 11 can be constructed in a shape of a loop embracing the toroid-like element 9 (FIG. 5). The toroid-like element 9 can be interposed between two current-conducting biasing busbars 11a, 11b being opposite to each other (FIG. 7) or between four current-conducting biasing busbars 11a, 11b, 11c, 11d, Two busbar 11a and 11b are arranged opposite to each other above the equatorial plane of the toroid-like element 9, and the other two 11c and 11d, are arranged opposite to each other below the equatorial plane of the toroid-like element 9 (FIG. 8 and FIG. 9). The current-conducting signal busbars 10, or at least one of them are arranged transversely relative to the current-conducting biasing busbars.

The memory device (FIG. 10) comprises a memory array 13, made from information memory cells which comprise toroid-like elements 14, current-conducting biasing busbars 15 and current-conducting signal busbars 16, a reference memory cell comprising a toroid-like element 17, a current-conducting biasing busbar 15 and a current-conducting signal busbar 18, a signal generator 19, a biasing current generating unit 20, a data writing currents generating unit 21, a triggering unit 22, an address decoder 23, a detectors assembly 24, an electronic control unit 25 and a controller 26.

In FIG. 14–FIG. 16, 34 is an information memory cell, 35 is reference memory cell, and 36 is a current-conducting biasing busbar.

The information memory cells within the memory device (FIG. 10) are organized into blocks which provide the word-by-word random access to the information. The blocks of memory cells form a memory array 13 having K rows and L columns, where K is the number of current-conducting biasing busbars 15 and L is the number of current-conducting information busbars 16.

Each of the K current-conducting biasing busbars 15 of the memory array 13 and the current-conducting biasing busbar 15 of the reference memory cell are connected to appropriate output of the biasing current generating unit 20. Each of the L current-conducting signal busbars 16 of the information memory cells is connected to an appropriate output of the data writing current generating unit 21, and the signal busbar 18 of the reference memory cell is connected to the output of the triggering unit 22. The signal inputs of the biasing current generating unit 20, the data writing current generating unit 21 and the triggering units 22 are connected to the output of the signal generator 19. The first and the second outputs of the address decoder 23 are connected to the K address inputs of the biasing current generating unit 20 and to the L address inputs of the data writing current generating unit 21, respectively.

Each of the L current-conducting signal busbars 16 of the information memory cells and the current-conducting signal busbar 18 of the reference memory cell are connected to the appropriate inputs of a detectors assembly 24, the L outputs of which are connected with the information inputs of an electronic control unit 25. The address code outputs and data outputs are connected to the inputs of the address decoder 23 and to the L data inputs of the data writing current generating unit 21, respectively. The control signal output of the electronic control unit 25 is connected to the input of the triggering unit 22.

The address code inputs, the data inputs-outputs and the control signals inputs-outputs of the electronic control unit 25 are connected to the appropriate outputs and inputs-outputs of the controller 26. The information input of the triggering unit 22 is signal logical I input.

The reference memory cells 35 (FIG. 14–FIG. 16) can be arranged in different ways relative to the information memory cells 34 and to the current-conducting biasing busbar 36. Each of the reference memory cells 35 can be placed symmetrically to the corresponding information memory cell 34 with respect to the axial line of the current-conducting busbar 36 (FIG. 14). Each of the reference memory cells 35 and a corresponding adjacent information memory cell 34 also can be placed on one side from the current-conducting biasing busbar 36 (FIG. 15), or each of the reference memory cells 35 can be interposed between two appropriate information memory cells 34, which are placed on one side from the current-conducting biasing busbar 36 (FIG. 16).

The reference memory cells can be made in the shape of a reference array, the geometrical dimensions of which are identical with the geometrical dimensions of the memory array, in this case both arrays are arranged symmetrically about the biasing current generating unit and the detectors assembly.

Figure 1:
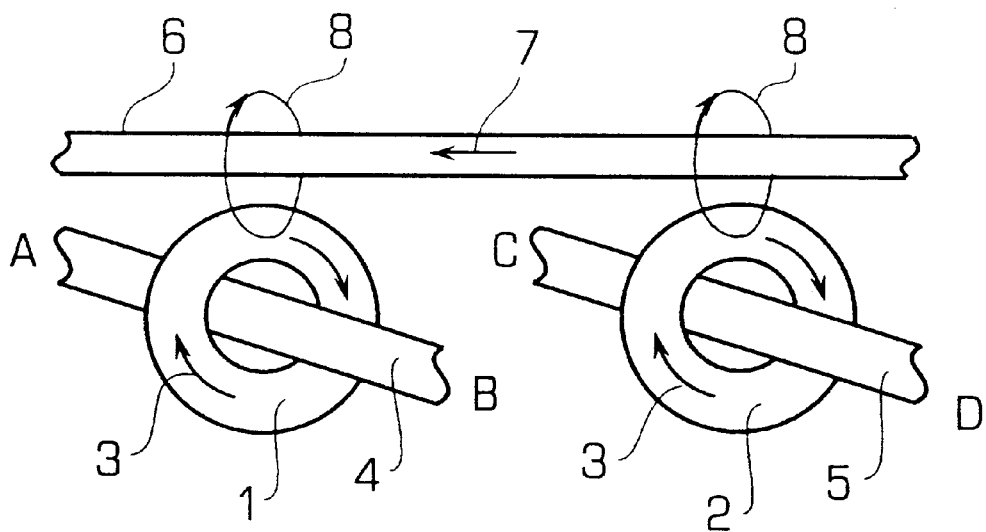
FIG. 1 gives a graphic illustration of the method for write and read of information.

The accomplishment of the data writing and reading method will be apparent from the graphic illustration given in FIG. 1, where 1 is the informational pattern; 2 is the reference pattern; 3 is the direction of orientation of the closed magnetic flux; 4, 5 are the current-conducting signal busbars; 6 is the current-conducting biasing busbar; 7 is the direction of the current flux within the busbar 6; 8 is the direction of the biasing magnetic field; A, B and C, D are the points at the busbars 4 and 5 respectively.

The method of writing and reading of information is realized in the following manner. In the material, for example ferromagnetic, the toroid-like patterns are formed, each of which has a closed magnetic flux of a certain direction of orientation structure (FIG. 1) formed from these toroid-like patterns comprise an information toroid-like pattern 1 and a reference toroid-like pattern 2, both having the same direction 3 of the closed magnetic flux (for simplification the realization of the method is demonstrated with one structure).

The information and the reference toroid-like patterns 1 and 2 are magnetized so that the magnetic flux may be closed therein and have a certain direction of orientation. The the toroid-like patterns can be in two magnetization states which differ from each other by the magnetic flux direction (clockwise or counterclockwise). This allows a pattern to be used as a unit of data storage.

When a unit of alternative data is written within one structure, the orientation direction 3 of the closed magnetic flux is changed by exposing the information pattern 1 to the time and magnitude correlated (for example simultaneously) action of mutually intersecting biasing and magnetic reversal alternative magnetic fields. For this purpose the current-conducting signal busbar 4 and a current-conducting biasing busbar 6 are used. The busbar 4 extends into the interior of the toroid ring of the information pattern 1 and the busbar 6 is place outside of the toroid. The busbar 4 generates a vortex magnetic field in the information pattern 1, which is aligned with or opposed to the direction of magnetization of the information pattern 1, and the busbar 6 generates a magnetic field perpendicular to the magnetization of the information pattern 1. This cause the magnetization reversal of the information pattern 1 (a change of the toroid moment direction) to take place.

The writing of a unit of data within a single structure can also be done by acting on the information pattern 1 with one or several pulses of the magnetic field with magnetic reversal under constant action of the biasing magnetic field. The magnetic reversal currents are determined by the coercitivity of the magnetic material, and the direction of the magnetic reversal is determined by the current direction in the busbar 4.

In order to provide the reading process the reference pattern 2 is magnetized in the triggering mode with an appropriate direction of the magnetic field orientation. Two busbars are used for this purpose: a current-conducting signal busbar 5 and a current-conducting biasing busbar 6. The busbar 5 extends through the interior of the ring of the reference pattern 2, and the busbar 6 is located outside of the toroid. The busbar 6 may be common for both the information and the reference patterns 1 and 2.

To read the information written in the information pattern 1, the information and the reference toroid-like patterns 1 and 2 are exposed to the biasing alternating magnetic field. For this purpose the alternating current 1 of frequency ω is passed through the busbar 6 in the direction of arrow 7. As a result, periodic oscillations of magnetic dipoles of particles with a double frequency 2ω occur in the information pattern 1 and in the reference pattern 2. An electromotive force of induction with the frequency 2ω appears between points A, B of the busbar 4 and between points C, D of the busbar 5. The phases of the induced electromotive forces are unambiguously determined by the orientation direction of the magnetic fields in the toroid-like patterns 1 and 2.

The comparison of the phases of the induced electromotive forces of the information and reference patterns 1 and 2 allows one to determine the value (logical 0 or logical 1) of data units written in the information pattern 1.

The rate of the magnetic reversal of a toroid-like pattern depends mainly on the magnitude and the rate of applying the biasing and magnetization reversal magnetic field. There frequencies can be up to 100 MHz. This allows one to write a data unit for 10 ns and thus to meet the requirements of the modern high-speed computing technology.

The magnetic reversal currents are limited from below by the coercitivity and the volume of the magnetic material in the toroid-like pattern, which determine the energy consumption E for the process of magnetic reversal, and from above by the energy of thermal motion kT. For reliable data storing at different temperature exposures, the energy consumption must exceed the energy of the thermal motion. If E=5 kT, the total current 1 in the busbars 4 and 6 at a voltage of 5 V will be 50 mA. At an average data writing rate of 100 MB/s, the energy consumption for the magnetic reversal will be about 7×10 exp (−14) W. Considering that the electrical resistance of the busbars 4 and 5 does not limit the write and read process, the ohmic losses are not more than 0.01 of the useful power, and therefore the thermal flux will have a tolerable magnitude of approximately 7×10 exp (−16) W.

The above description of the data write and read method is also valid when the toroid-like patterns are formed from a superconducting material, such as for example, high temperature superconducting ceramics.

Figure 2:
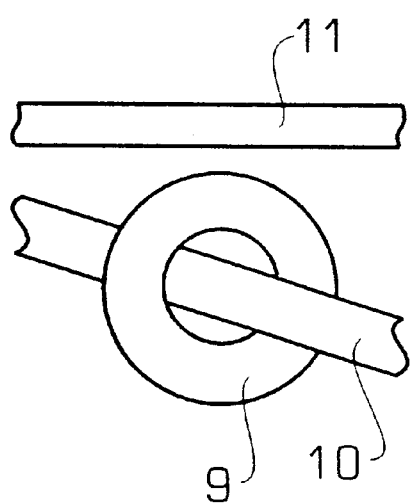
FIG. 2 shows a structure of the memory cell.

The memory cell operates as follows. Referring to FIG.2 and FIG. 3, for the magnetic reversal of the toroid-like element 9, a space-time configuration of the magnetic field is constructed within the volume of that toroid-like element 9 in the memory cell. This is accomplished by using at least one current-conducting signal busbar 10 extending into the axial opening of the toroid-like element 9 for generating a vortex magnetic field within the element and at least one current-conducting biasing busbar 11 placed outside of the toroid-like element 9 for generating a magnetic field therein which is transverse relative to the vortex field.

In conformity with the invention the different embodiments of the memory cells can have different constructions as is shown in FIG. 3–FIG. 9 and described above.

The memory cell provides operations both in the write and in the read modes with nondestructive reading of the data written in a memory cell.

The design and functions of the memory cell allows its use both as an information and as a reference memory cell.

Figure 10:
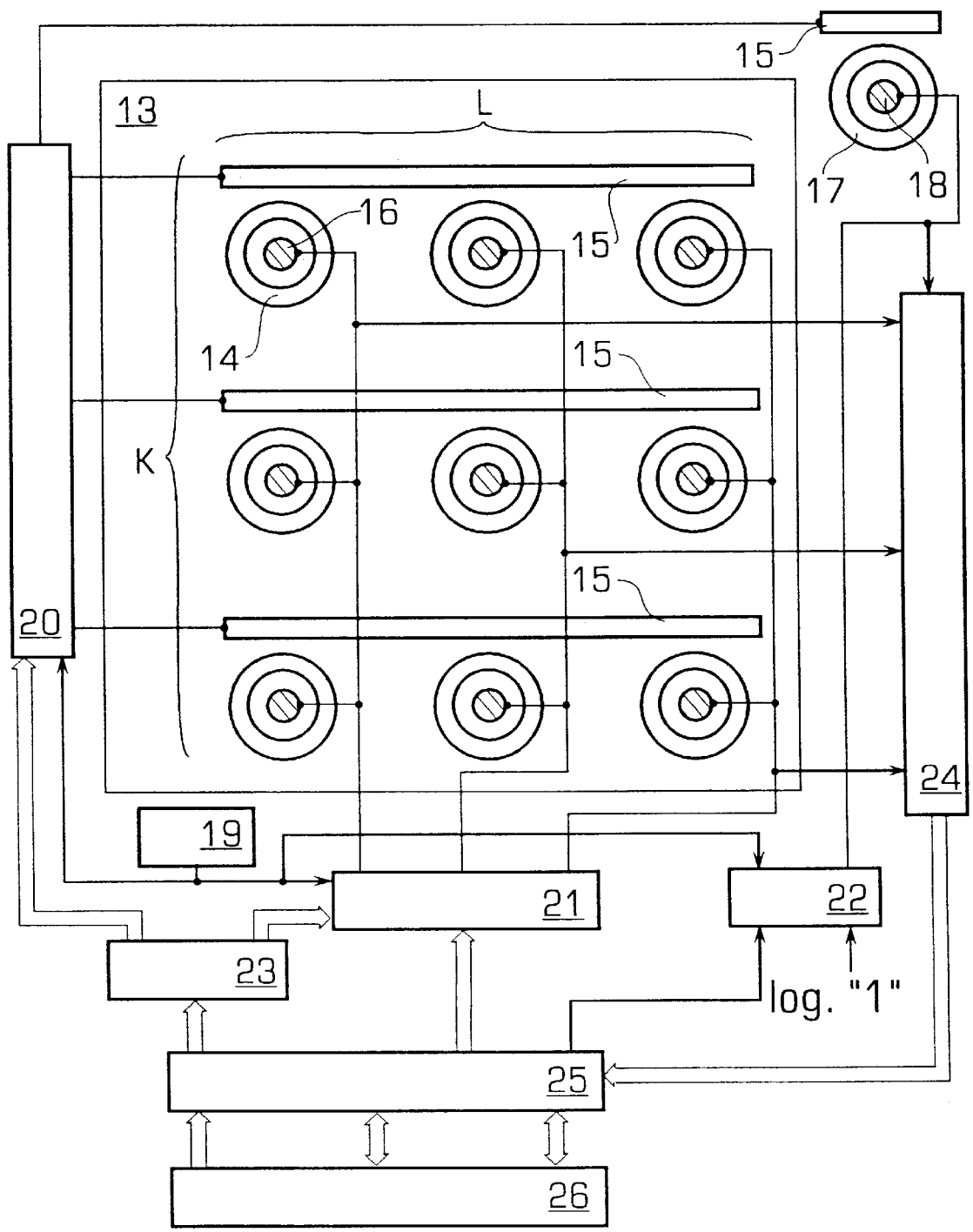
FIG. 10 shows the functional block-diagram of a memory device.

The memory device operates as follows. The information memory cells are organized into blocks providing word-by-word random access to the information. The blocks of information memory cells form a memory array 13 comprising K rows and L columns, where K is the number of current-conducting biasing busbars and L is the number of current-conducting signal busbars (FIG. 10).

When the memory cell is in the initial state, each of the toroid-like elements 14 of the information memory cell and the toroid-like element 17 of the reference memory cell have a closed magnetic flux and a random direction of orientation.

In order to determine the values of the read information unambiguously, one triggers the memory device by writing a logical 1 into the toroid-like element 17 of the reference memory cell. This imposes a definite direction of orientation of the closed magnetic flux of the reference cell.

The writing of data into information memory cells of the array 13 is done in the following manner. A signal from the output of the signal generator 19 enters the signal input of the biasing current generating unit 20 which comprises (FIG. 11) K electronic switches 27. A The first input of each of those switches receives a signal from the signal generator 19, and the second input of each of the electronic switches 27 receives a signal from one of the K outputs of the address decoder 23. The output of each of electronic switches 27 is connected to an appropriate input of the multi-input logical element OR 28, whose output and the outputs of each of the K electronic switches 27 are (K+1) outputs of the biasing current generating unit 20.

Thus, in conformity with one of the K addresses of the biasing current generating unit 20 K output signals enter the appropriate current-conducting biasing busbars 15 and an output signal enter the current conducting biasing busbar 15 of the reference memory cell are generated.

A signal from the output of the signal generator 19 also arrives at the signal input of the data writing current generating unit 21, which contains (FIG. 12) L groups. In each of these groups a signal from the output of the signal generator 19 arrives directly at a first input of an electronic switch 29 and through a logical element (inverter) NOT 31 at the first input of an electronic switch 30. The second inputs of the electronic switches 29 and 30 are combined and attached to one of the L outputs of the address decoder 23. Data from the electronic control unit 25 arrives at the third input of the electronic switch 29 directly and at the third input of the electronic switch 30 through the logical element (inverter) NOT 32. The combined output of the electronic switches 29 and 30 is one of the L outputs of the data writing current generating unit 21.

Thus, in conformity with one of the L addresses L output signals are generated in the data writing current generating unit 21. Each of the L output signals enters a current-conducting signal busbar 16 of one of the information memory cells. With the signal logical I at the data input of the data writing current generating unit 21, its corresponding output will have a phase which coincides with the phase of the signal arriving from the output of the signal generator 19.

Therefore, the toroid-like elements 14 of the information memory cells are exposed to the mutually intersecting biasing and magnetic reversal alternative magnetic fields which change the direction of the closed magnetic flux in the toroid-like elements 14 during writing the alternative information.

The write of a logical 1 unit into the reference memory cell is done as follows. In response to a control signal from the controller 26, a signal "control of the triggering mode" is formed in the electronic control unit 25. This signal enables writing of the signal logical 1 from the output of the triggering unit 22 into the reference memory element. The triggering unit 22 (FIG. 13) is made as a three-input logical element AND 33. At the first, second and third inputs, the signal from the signal generator 19, the signal "control of the triggering mode" and the signal logical 1 arrive. The signal from the output of the triggering unit 22, whose phase coincides with the phase of the signal generator 19 output signal, is imparted to the signal busbar 18 of the reference memory cell. A signal from the output of the logical element OR 28 of the biasing currents generating unit 20 is simultaneously forwarded to the busbar 15. This results in writing a logical 1 into the reference memory cell.

The bits of one information word are written in information cells, whose toroid-like elements 14 are biased by one current-conducting busbar 15. This permits the writing and reading of all W bits of a word simultaneously in one cycle, in this case L=W. If the word length is large enough, it can be build by a logical combination of several rows L of one or several memory arrays 13.

The reading of information is implemented as follows.

A signal from the output of the signal generator 19 enters the signal input of the biasing current generating unit 20, where, in conformity with one of K addresses coming from the first outputs of the address decoder 23, K output signals are formed and fed into the corresponding current-conducting biasing busbar 15 of information memory cells. An output signal is formed and fed into the current-conducting biasing busbar 15 of the reference memory cell. As a result, the toroid-like elements 14 of information memory cells and the toroid-like element 17 of the reference memory cell are exposed to the alternative biasing field.

The phases of signals that arrived at appropriate inputs of the detector assembly 24 from any or every K×L information memory cells are compared with the phase of a signal that arrived from the reference memory cell. After detection, the signals go from the outputs of the detector assembly 24 to the information inputs of the electronic control unit 25, where the value of the information unit written into an information memory cell is determined.

The development of address codes, data signals and control signals is carried out within the electronic control unit 25 by instructions coming from appropriate outputs and inputs-outputs of the controller 26.

Figure 17:
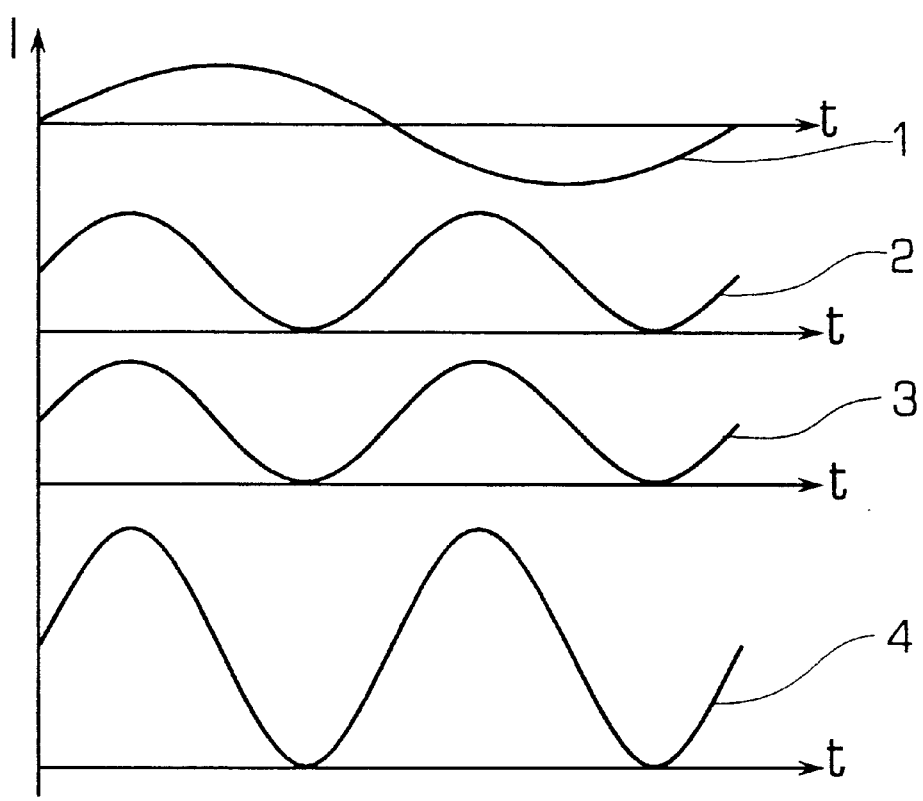
FIG. 17 and FIG. 18 show the time diagrams of the memory device operations in the read mode.
Figure 18:
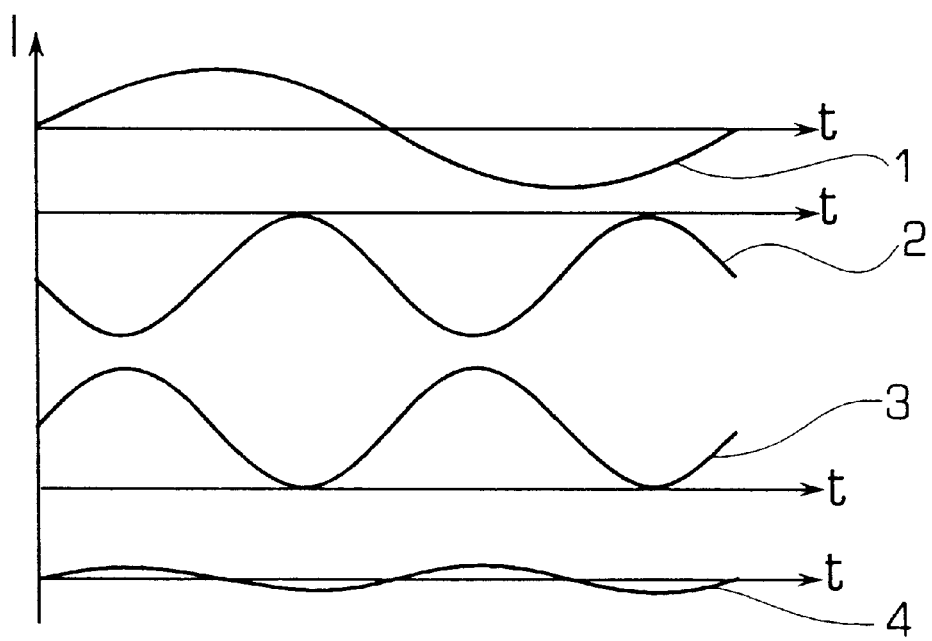

The data reading process is shown in the time diagrams (FIG. 17 and FIG. 18). In FIG. 17, 1 is a signal at the signal generator's output; 2 is a signal at the output of the information memory cell in the unity state; 3 is a signal at the output of the reference memory cell, and 4 is a signal at the output of the detector assembly.

In FIG. 18, 1 is a signal at the output of the signal generator; 2 is a signal at the output of an information memory cell, in the zero state; 3 is a signal at the output of the reference memory cell; 4 is a signal at the output of the detector assembly.

The proposed method of toroid writing and reading of data, and devices to realize the same, allow development of a non-volatile and durable solid-state random access memory device of multilayer structure with a write density up to 100 MB/cm$^2$ per layer. The memory device allows an unlimited number of data write and read cycles at the reading rate of 10–100 GB/s, clock frequency of 100–1000 MHz and access time less than 10 ns. Additionally, the solid-state memory device has a low dissipation power (100 mW) and is resistant to various exposures (radiation, temperature, electricity).

The above-mentioned factors ensure wide practical application of the invention and allow a new class of magnetic memory device known as MTRAM (Magnetic Toroid Random Access Memory), to be created.

What is claimed is:

1. A method of writing and reading information in toroid-like patterns, the toroid-like patterns forming a structure including at least one information pattern and at least one reference pattern, each toroid-like pattern having a closed magnetic flux with a predetermined direction of twisting corresponding to a unit of information, the method comprising writing a unit of information within a structure by changing the twisting direction of the closed magnetic flux in appropriate ones of the toroid-like patterns of the structure, said changing comprising exposing the toroid-like information patterns of the structure to a correlated action of intersecting biasing and magnetic reversal alternative magnetic fields having predetermined times and magnitudes, and reading a unit of information within the structure by applying to the information and the reference patterns an alternative biasing magnetic field, detecting output signals corresponding to the information and reference patterns of the structure, and based on the character of the signals, determining the value of a unit of information written into a toroid-like information pattern.

2. The method of toroid writing and reading of claim 1, wherein said writing of a unit of information comprises writing within a single structure by acting on an information pattern of the structure with one or more pulses of the magnetic reversal magnetic field in the presence of another biasing magnetic field.

3. The method of toroid writing and reading of claim 1, wherein the toroid-like patterns are formed from a superconducting material including high-temperature superconducting ceramics.

4. A memory cell comprising a toroid-like element of magnetic material disposed in an insulating medium, means in the said cell for magnetic reversal of the toroid-like element through developing within the element a predetermined space-time configuration of a magnetic field, current-conducting signal busbar passing through an axial opening in the toroid-like element for generating a vortex magnetic field in the element, and at least one current-conducting biasing busbar outside the toroid-like element for generating in the toroid-like element a magnetic field transverse to the vortex magnetic field.

5. The memory cell of claim 4, wherein the insulating medium comprises a dielectric material, and the current-conducting signal and the current-conducting biasing busbars are of a conducting magnetic material.

6. The memory cell of claim 4, wherein the toroid-like element comprises a conducting magnetic material, and the toroid-like element, and the current-conducting signal and biasing busbars are isolated from each other by an insulating material.

7. The memory cell of claim 4, wherein the toroid-like element comprises a nonconducting magnetic material, and the current-conducting biasing busbar is placed directly on the toroid-like element.

8. The memory cell of claim 4, wherein the toroid-like element is interposed between two current-conducting biasing busbars arranged oppositely to each other, and wherein at least one of the current-conducting signal busbars is arranged transverse to the current-conducting biasing busbars.

9. The memory cell of claim 4, wherein the toroid-like element is interposed between four current-conducting biasing busbars, two of said current-conducting biasing busbars being arranged oppositely to on other above an equatorial place of the toroid-like element, and another two of the current-conducting biasing busbars being arranged oppositely to one other below the equatorial place of the toroid-like element.

10. The memory cell of claim 4, wherein the current-conducting biasing busbar comprises a loop embracing the toroid-like element.

11. The memory cell of claim 4, wherein a portion of the toroid-like element adjacent to the current-conducting biasing busbar is of a magnetically hard material, and the cell further comprises a magnetoclosing portion of a magnetically soft material.

12. A memory device comprising a plurality of toroid-like elements forming informational memory cells and at least one reference memory cell and organized into blocks to form a memory array of K rows and L columns, each toroid-like element having a closed magnetic flux with a predetermined direction of twisting; means for reversing the direction of twisting of the magnetic flux in the toroid-like elements, the reversing means comprising at least one current-conducting signal busbar and at least one current-conducting biasing busbar; an electronic control unit; a signal generator; a biasing current generating unit; a data writing current generating unit; a triggering unit; an address decoder; a detector assembly; and a controller connected to the electronic control unit, each of the current-conducting biasing busbars of said information memory cells and said at least one reference memory cell being connected with appropriate outputs of the biasing current generating unit, and said current-conducting signal busbars of the information memory cells being connected with appropriate outputs of the data writing current generating unit, the current-conducting signal busbar of the at least one reference memory cell being connected with the output of the triggering unit; the output of the signal generator being connected to signal inputs of the biasing current generating unit, the data writing current generating unit, and the triggering unit, first and second outputs of the address decoder being connected to address inputs of the biasing current generating unit and to address inputs of the data writing current generating unit, respectively; the current-conducting signal busbars of the information memory cells and a current-conducting signal busbar of the at least one reference memory cell being connected to corresponding inputs of the detector assembly; the detector assembly having outputs connected to information inputs of the electronic control unit; and the electronic control unit having address code outputs and data outputs being connected to inputs of the address decoder and to data inputs of the data writing current generating unit, respectively; the electronic control unit providing a control signal to a control input of the triggering unit; the address code inputs, the data inputs and outputs, and the control signal inputs and outputs of the electronic control unit being connected to corresponding outputs and inputs of the controller; and the triggering unit having an information input for receiving a logical one signal.

13. The memory device of claim 12, wherein said at least one reference memory cell and an adjacent information memory cell are located on the same side of the current-conducting biasing busbar.

14. The memory device as in claim 12, wherein said at least one reference memory cell is interposed between two information memory cells, which are placed on the same side of a current-conducting biasing busbar.

15. The memory device as in claim 12, wherein said at least one reference memory cell is positions symmetrically with an information memory cell about an axial line of a current-conducting biasing busbar.

16. The memory device of claim 12, wherein there are a plurality of reference memory cells in the shape of a reference array having geometrical dimensions of which are similar to geometrical dimensions of the memory array, and the memory array and the reference array are positioned symmetrically about the biasing current generating unit and the detector assembly.

17. The memory cell of claim 5, wherein said dielectric material comprises silicon oxide, and said conducting magnetic material comprises silver.

18. The memory cell of claim 7, wherein said nonconducting magnetic material comprises ferric oxide.

19. The memory cell of claim 11, wherein said magnetically hard material comprises a ferrite, and said magnetically soft material comprises Permalloy.

* * * * *